United States Patent [19]
Gates et al.

[11] Patent Number: 5,012,127
[45] Date of Patent: Apr. 30, 1991

[54] SYNCHRONIZER CIRCUIT WITH ASYNCHRONOUS CLEARING

[75] Inventors: Dennis E. Gates; Bret S. Weber, both of Wichita, Kans.

[73] Assignee: NCR Corporation, Dayton, Ohio

[21] Appl. No.: 100,499

[22] Filed: Sep. 24, 1987

[51] Int. Cl.$^5$ ............................ H03K 5/13; H03K 3/01
[52] U.S. Cl. .................................. 307/269; 307/247.1; 307/480; 328/63
[58] Field of Search .................. 307/269, 480; 328/63, 328/58, 72, 59; 375/106, 110

[56] References Cited

U.S. PATENT DOCUMENTS

| | | | |
|---|---|---|---|
| 4,392,226 | 7/1983 | Cook | 307/269 |
| 4,663,769 | 5/1987 | Krinock | 375/110 |

FOREIGN PATENT DOCUMENTS 0058382 4/1984 Japan ..................................... 307/480

*Primary Examiner*—Timothy P. Callahan
*Attorney, Agent, or Firm*—Wilbert Hawk, Jr.; Stephen F. Jewett; Edward Dugas

[57] ABSTRACT

The present circuit incorporates a latch which latches an asynchronous input signal and provides a latched output signal to the first stage of a two stage synchronizer. An AND gate receives the latched output signal and the output from the first stage such that the output signal from the AND gate follows the output of the first synchronizer and is presented as an input to a second stage of the two stage synchronizer. The second stage is clocked, as is the first stage, with the system clock signal to provide the synchronized output signal. An asynchronous reset of the latch causes the output of the AND gate to go low which in turn causes the output of the second stage to go low asynchronously.

7 Claims, 2 Drawing Sheets

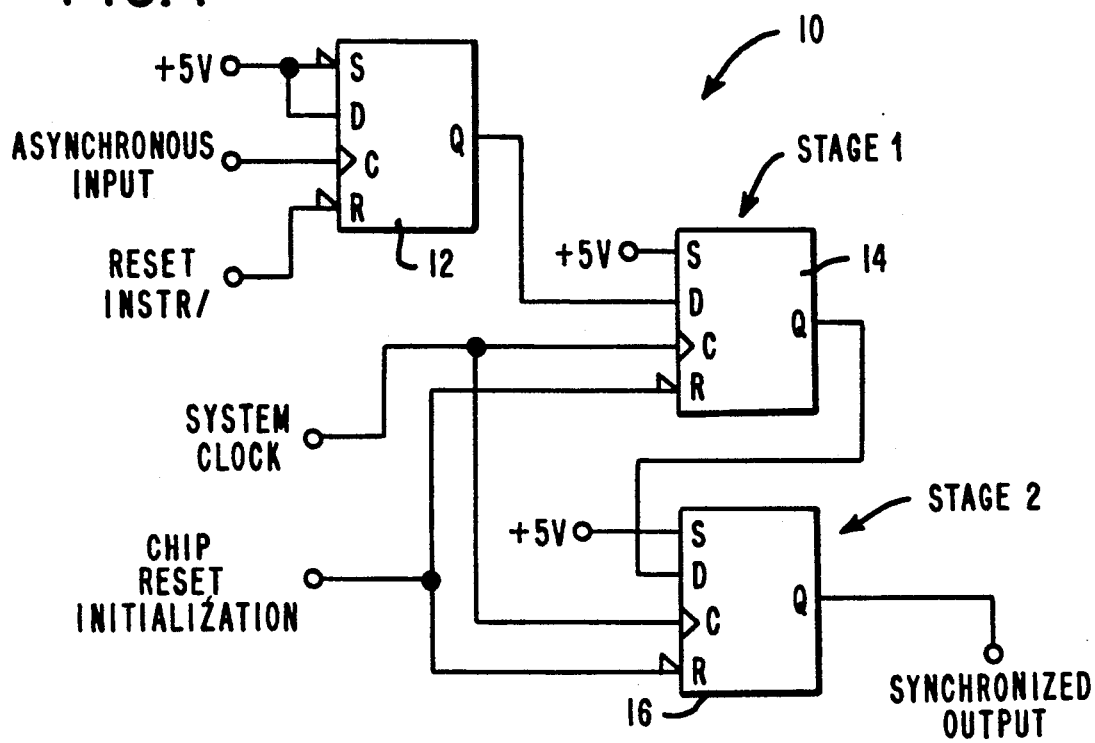
FIG. I   PRIOR ART
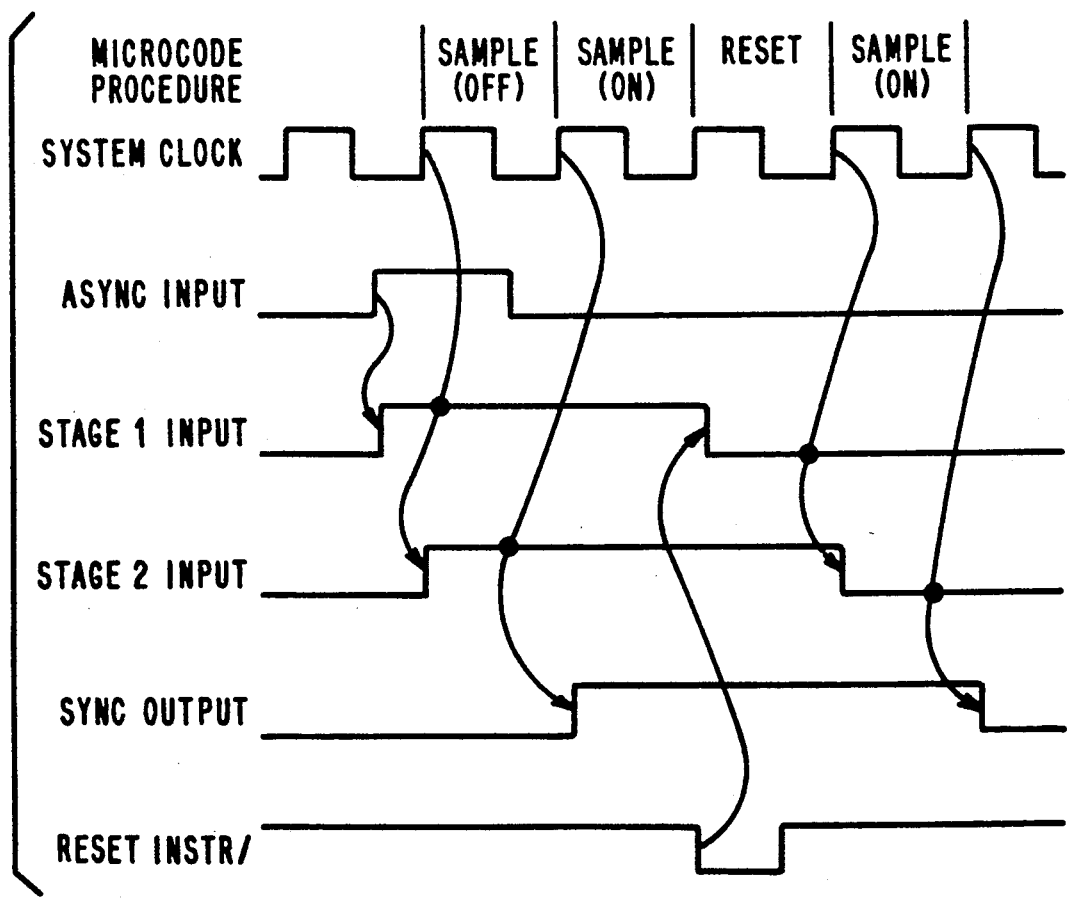
FIG. 2   PRIOR ART

SYNCHRONIZER CIRCUIT WITH ASYNCHRONOUS CLEARING

BACKGROUND OF THE INVENTION

The present invention is an improved circuit for providing synchronization for microcontroller branch input condition signals and for providing asynchronous clearing.

In a microcontroller application, branch input condition signals are latched and synchronized by synchronizer circuits which also respond to a reset condition (clearing signal) in a microcode sequence but, which because of the circuits delay in responding to the reset condition makes certain microcode sequences unusable. These synchronizers impose undesirable microcoding constraints due to the fact that the turn off condition, triggered by the reset condition, is also synchronized and upon receipt of the reset condition it takes an additional two clock cycles before the output makes a transition.

The present invention solves this problem by providing synchronization for the front edge of the input signal while permitting an asynchronous resetting on the back edge of the input signal. Resetting can occur one clock cycle earlier so that, for example, the next loop instruction in a microcode sequence of the type calling for a Loop 1, RESET and Loop 2 is executed within one clock cycle after receiving the reset condition.

SUMMARY OF THE INVENTION

The asynchronous circuit of the present invention has a first latch having a data input, a clocking input and a reset input. The data input is connected to a potential source of one logic level, the clocking input is connected to receive an asynchronous input signal and the reset input is connected to receive a reset signal. A second latch has a data input connected to the output of the first latch and a clocking input for connection to a system clock signal. A logic gate having at least two inputs is connected to receive the output signals from the first and the second latch. A third latch having a data input and a clocking input has the data input connected to the output of the logic gate and the clocking input connected to a system clock signal such that the output signal from the third latch is a synchronized version of the asynchronous signal which may be asynchronously cleared upon receipt of a reset signal by the reset input of the first latch.

From the foregoing, it can be seen that it is a primary object of the present invention to provide a synchronizing circuit which may be cleared asynchronously.

It is another object of the present invention to provide an asynchronous clearing circuit using a minimum number of circuit parts.

It is a further object of the present invention to provide a latching synchronizing circuit which can be cleared in less time than prior art circuits.

These and other objects of the present invention will become more apparent when taken in conjunction with the following description and drawings wherein like characters indicate like parts and which drawings form a part of the present specification.

BRIEF DESCRIPTION OF THE DRAWINGS

FIG. 1 illustrates in circuit diagram form a prior art synchronous circuit.

FIG. 2 illustrates a group of waveforms which occur at points within the prior art circuit of FIG. 1 when it is in operation.

DESCRIPTION OF THE PREFERRED EMBODIMENT

Figure 3:
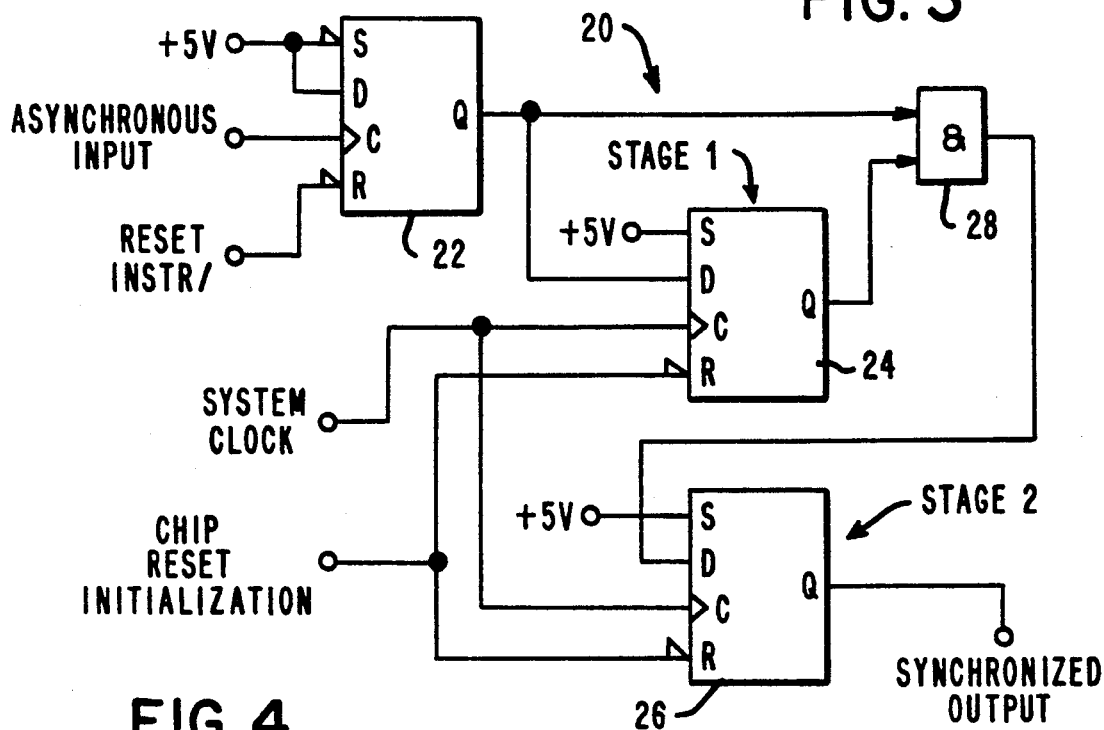
FIG. 3 illustrates in circuit diagram form the preferred embodiment of the invention.

In FIG. 1, there is illustrated a prior art circuit 10 comprised of three latching circuits 12, 14 and 16 that are D-type flip-flops. Each latching circuit has a set, data, clock and reset input labeled S, D, C and R, respectively and an output labeled Q. The first latching circuit 12, has the set, S, and data, D, inputs tied to a fixed logic level of +5V. The clocking input, C, is connected to receive an ASYNCHRONOUS INPUT signal and the reset input, R, is connected to receive a reset signal designated RESET INSTR/. The output, Q, of the first latch is directed to the data input, D, of the second latch 14. The second latch has its set input, S, connected to the +5V fixed logic level, its clocking input, C, connected to the SYSTEM CLOCK and its reset input, R, connected to receive a CHIP RESET INITIALIZATION signal, which signal corresponds to the signal used to reset the system within which the present circuit is incorporated. A third latch 16 has its set input, S, connected to the +5V fixed logic level and its clock and reset inputs, C and S, respectively, connected to receive the SYSTEM CLOCK and the CHIP RESET INITIALIZATION signal, respectively. The Q-labeled output of the second latch is connected to the data input, D, of the third latch. The Q-labeled output of the third latch is the circuit output on which the SYNCHRONIZED OUTPUT signal appears.

Referring now to the waveforms of FIG. 2, in conjunction with the circuit of FIG. 1, the SYSTEM CLOCK signal is shown as a periodic symmetrical string of pulses. The transition of the ASYNC INPUT signal from a low to a high level appears at the output of the latch 12 and at the input of the second latch during the same ½ clock cycle due to the fact that the S and D inputs are strapped to +5V.

The second latch is denoted generally as STAGE 1 in the synchronization process and the third latch 16 is denoted generally as STAGE 2. The STAGE 1 INPUT signal goes to the high level, as driven by the transition of the ASYNC INPUT signal, which in turn upon the occurrence of the transition in the SYSTEM CLOCK, causes the input of the STAGE 2 latch to go high. The output of the STAGE 2 latch, which is the SYNCHRONIZED OUTPUT, follows the input upon the SYSTEM CLOCK signal making its next transition from the low to the high level. A RESET INSTR/ occurring at this time effects a transition in the STAGE 1 input signal causing it to transcend from the high level to the low level. This transition, at the occurrence of the next cycle of the SYSTEM CLOCK signal going from the low to the high level, causes the output of the STAGE 1 latch to go from the high to the low level which places the low level signal on the data input, D, of the STAGE 2 latch and upon the occurrence of the next transition of the SYSTEM CLOCK signal from the low to the high level, provides the low level signal on the Q output of STAGE 2. As can be seen from the waveform analysis, from the time of receiving the RESET INSTR/ signal to the time of the transition of the SYNC OUTPUT signal from a high to a low, two cycles of the SYSTEM CLOCK occur.

Referring now to FIG. 3, the preferred circuit 20 of the present invention is comprised of three latches 22, 24 and 26, and an AND gate 28. The preferred circuit embodiment is similar to the circuit of FIG. 1 with the addition of the AND gate 28 interposed between the Q-output of the latch 24 and the D-input of the latch 26. In addition, the AND gate 28 receives as another input the signal present at the Q-output of the latch 22.

Figure 4:
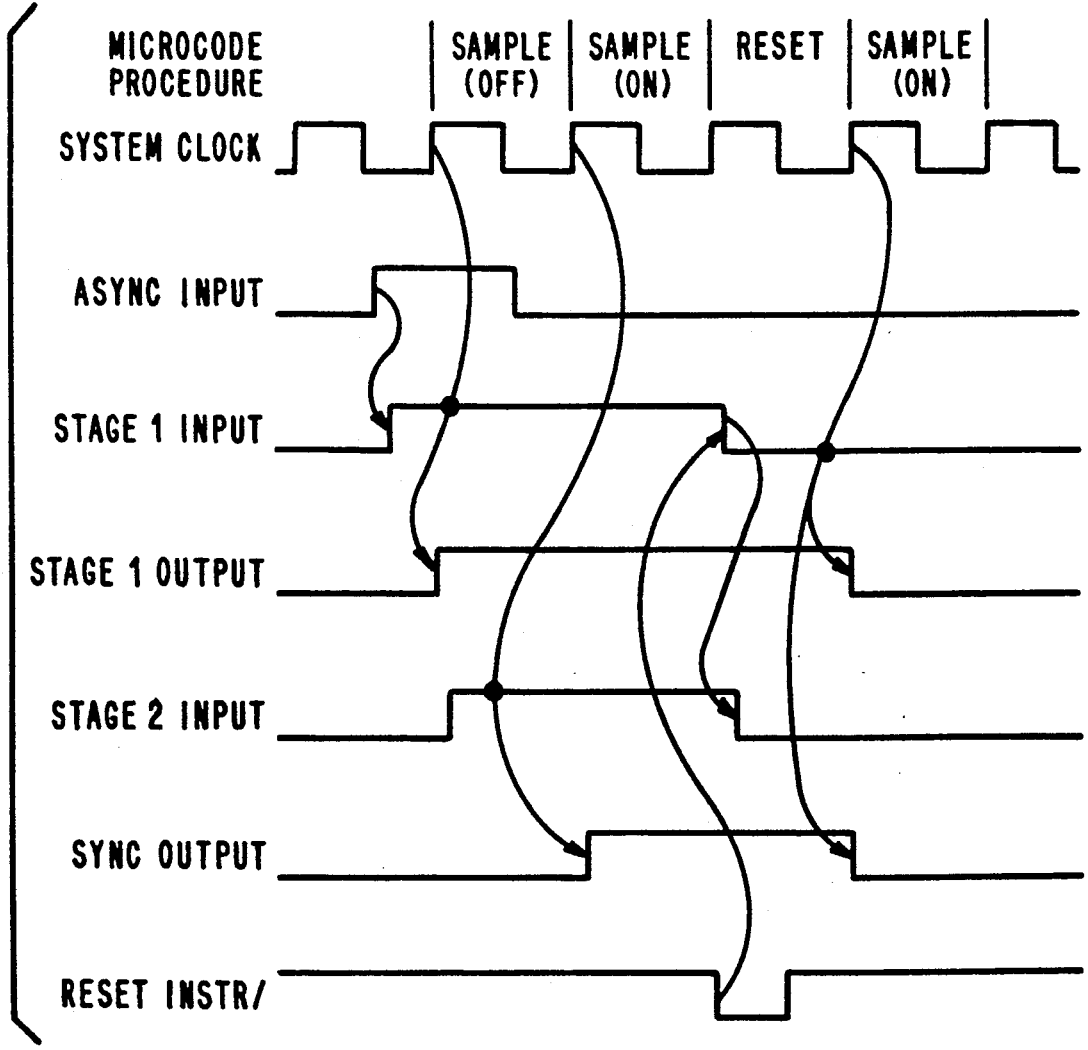
FIG. 4 illustrates a group of waveforms which occur at points within the circuit of FIG. 3 when it is in operation.

The operation of the preferred circuit embodiment will be described in conjunction with the waveforms of FIG. 4. The ASYNC INPUT signal applied to the clocking input C, of the latch 22, sets the latch such that the output goes high a short time after the ASYNC INPUT signal makes the transition from a low level to a high level. The output signal from the Q-output of latch 22 is directed to the D-input of latch 24 which latch comprises STAGE 1 of the preferred circuit embodiment. Upon the next low to high transition of the SYSTEM CLOCK signal, the STAGE 1 output assumes the logic level of the signal on the D-input and goes high. With the STAGE 1 output signal high and the signal at the output of the latch 22 high, the AND gate 28 outputs a high level signal to the D-input of the third latch 26 which forms STAGE 2 of the preferred embodiment. With the signal at the D-input of the third latch 26 being high, the next low to high transition of the SYSTEM CLOCK causes the Q-circuit output of the third latch 26 to assume a high logic level. When the RESET INSTR/ signal is received, the STAGE 1 input signal makes a transition from the high to the low level in turn which causes the signal at the output of the AND gate 28 to go from a high to a low level. Upon the next transition of the SYSTEM CLOCK going from the low to the high level the level of the signal on the D-input will be translated to the circuit output as the SYNC OUTPUT signal. A comparison of the number of clock pulses occurring between the time of the RESET INSTR/ pulse and the SYNC OUTPUT transition for the preferred embodiment is one clock cycle less than for the prior art circuit.

As can be seen from the previous description, the preferred circuit embodiment provides the required synchronization for an asynchronous input signal while improving the turn off time (or clearing) by permitting the reset to occur in an asynchronous manner.

Although the invention has been described and illustrated in detail, it is to be clearly understood that the same is by way of illustration and example only, and is not to be taken by way of limitation, the spirit and scope of the invention being limited only by the terms of the appended claims.

We claim:

1. A synchronizer circuit with asynchronous clearing comprising:
    a latch having a data input for receiving an asynchronous input signal that is to be synchronized to a system clock signal and having an output for providing a latched asynchronous input signal, said latch also having a reset input for receiving a clearing signal which resets the output of said latch;
    a first stage synchronizer having inputs for receiving said latched asynchronous input signal and a system clock signal and an output for providing a system clock synchronized version of said asynchronous input signal;
    a coincidence gate having one input connected to the output of said latch and another input connected to the output of said first stage synchronizer for providing at its output a signal which is a function of the coincidence of the signals at its inputs; and
    a second stage synchronizer having inputs for receiving the output signal from said coincidence gate and the system clock signal and an output for providing a second system clock synchronized version of said asynchronous input signal such that receipt of a reset input signal by said latch clears the output from said first and second stage synchronizers upon receipt of the next system clock signal.

2. A synchronizer circuit with asynchronous clearing according to claim 1 wherein said latch and said first and second stage synchronizers are D-type flip-flops.

3. A synchronizer circuit with asynchronous clearing according to claim 1 wherein said coincidence gate is a two input AND gate.

4. A synchronizer circuit with asynchronous clearing comprising:
    first means for synchronizing the asynchronous occurrence of an input signal to a system clock signal;
    second means for double synchronizing the output signal from said first means to the system clock signal; and
    gating means interposed between said first and said second means and responsive to the occurrence of an asynchronous reset signal for clearing said second means;
    wherein said reset signal clears said first and second means upon receipt of the next clock signal.

5. A synchronizer circuit with asynchronous clearing comprising:
    holding means for temporarily holding the state of a two state asynchronous input signal;
    first synchronizer means for synchronizing the held state of said two state asynchronous input signal to a system clock signal;
    a second synchronizer means for synchronizing the synchronized output from said first synchronizer means to the system clock signal; and
    a coincidence gate interposed between the input of said second synchronizer means and the outputs of said holding means and said first synchronizer means such that an asynchronous reset signal applied to said holding means causes said holding means to output a signal having a state other than the one previously held so as to effectively clear the output of said first and second synchronizer means upon receipt of the next clock signal.

6. A synchronizer circuit with asynchronous clearing according to claim 5 wherein said first and said second synchronizer means are D-type flip-flops.

7. A synchronizer circuit with asynchronous clearing according to claim 6 wherein said coincidence gate is a two input AND gate.

* * * * *